United States Patent
Garner et al.

(10) Patent No.: US 8,503,883 B2
(45) Date of Patent: Aug. 6, 2013

(54) SYSTEM AND METHOD FOR IMPROVED INFRARED COMMUNICATION BETWEEN CONSUMER APPLIANCES

(75) Inventors: Scott Garner, Huntington Beach, CA (US); Graham Williams, Corona Del Mar, CA (US); William L. Brown, Yorba Linda, CA (US)

(73) Assignee: Universal Electronics Inc., Cypress, CA (US)

( * ) Notice: Subject to any disclaimer, the term of this patent is extended or adjusted under 35 U.S.C. 154(b) by 1345 days.

(21) Appl. No.: 12/059,577

(22) Filed: Mar. 31, 2008

(65) Prior Publication Data
US 2009/0245804 A1 Oct. 1, 2009

(51) Int. Cl.
*H04B 10/00* (2006.01)

(52) U.S. Cl.
USPC ............ 398/106; 398/107; 398/108; 398/109

(58) Field of Classification Search
USPC ............... 398/106–109, 118–128, 129, 131, 398/135, 136, 137, 138, 151, 156, 158, 160, 398/162, 112, 130, 94, 95, 97, 159
See application file for complete search history.

(56) References Cited

U.S. PATENT DOCUMENTS

| | | | |
|---|---|---|---|
| 6,104,512 A | | 8/2000 | Batey, Jr. et al. |
| 6,218,955 B1 * | | 4/2001 | Conklin ...................... 340/5.61 |
| 6,784,872 B1 | | 8/2004 | Matsui et al. |
| 7,049,995 B2 * | | 5/2006 | Nierzwick et al. ........... 341/177 |
| 7,194,209 B1 | | 3/2007 | Robbins et al. |
| 7,266,301 B2 * | | 9/2007 | Stanchfield et al. .......... 398/126 |
| 8,180,352 B2 * | | 5/2012 | Nordmark et al. ............ 455/445 |
| 2002/0114038 A1 * | | 8/2002 | Arnon et al. .................. 359/145 |
| 2003/0005462 A1 * | | 1/2003 | Broadus et al. ............... 725/110 |
| 2003/0128988 A1 * | | 7/2003 | Hamilton ...................... 398/120 |
| 2004/0103443 A1 * | | 5/2004 | Kuznetsov et al. ........... 725/132 |
| 2005/0047794 A1 | | 3/2005 | Quintanar |
| 2005/0053378 A1 * | | 3/2005 | Stanchfield et al. .......... 398/115 |
| 2005/0190073 A1 * | | 9/2005 | Berges et al. ............. 340/825.72 |
| 2007/0196110 A1 * | | 8/2007 | Mikkelsen et al. ........... 398/140 |
| 2008/0309641 A1 * | | 12/2008 | Harel et al. ................... 345/173 |

FOREIGN PATENT DOCUMENTS

| | | | |
|---|---|---|---|
| JP | 2000-111400 | * | 4/2000 |
| JP | 2000-111400 A | * | 4/2000 |
| WO | WO 2008/006766 A1 | * | 1/2008 |

* cited by examiner

*Primary Examiner* — M. R. Sedighian
(74) *Attorney, Agent, or Firm* — Greenberg Traurig, LLP

(57) ABSTRACT

Optical or electrical attenuation is provided at the infrared (IR) receiver of a first device, such as a remote control, together with a commensurate increase in output of the IR transmitter of an appliance, such as a set top box, to improve the signal-to-noise ratio of IR communications with respect to any background infrared radiation, such as radiation from a plasma display screen.

15 Claims, 7 Drawing Sheets

SYSTEM AND METHOD FOR IMPROVED INFRARED COMMUNICATION BETWEEN CONSUMER APPLIANCES

BACKGROUND

Controlling devices, that is, for example, remote controls capable of commanding operation of features and functions of consumer electronic appliances such as TVs, audio receivers, set top boxes, home automation systems, and the like, are well known in the art and have become a ubiquitous part of the modern home. Increasingly, the utility of these devices is being enhanced by providing for two-way communication between a controlling device and at least one of the controlled appliances.

A historically preferred communication medium for such controlling devices is infrared, since this technology is relatively inexpensive, does not radiate outside of the user's immediate environment, and has proven reliable in existing unidirectional and low data rate applications. However, newer display technologies such as plasma TV screens are themselves strong sources of infrared radiation and may be problematic during two-way infrared-based communication between a controlling device and an appliance, in particular with respect to the infrared receiver in the controlling device which is likely to be pointed directly toward the vicinity of the TV screen while in use.

SUMMARY OF THE INVENTION

This invention relates generally to two-way infrared (IR) communication while in the presence of an appliance, such as a plasma TV, known to radiate noise in the infrared portion of the electromagnetic spectrum. In an exemplary system, a controlling device is adapted to communicate bi-directionally with a controlled appliance, e.g., a cable set top box, in order to perform activities such as interactive setup, downloading of upgraded appliance control data, favorite channel logos, program guide information, etc. Use of IR communication is facilitated by the provision of optical or electrical attenuation at the IR receiver of the controlling device together with a commensurate increase in output of the IR transmitter of the appliance, e.g., the set top box, thereby improving the signal-to-noise ratio with respect to any background infrared radiation, e.g., radiation from a plasma display screen. Such attenuation and boost may be fixed, or may be switched in response to detection of noise signals in the infrared spectrum.

A better understanding of the objects, advantages, features, properties and relationships of the invention will be obtained from the following detailed description and accompanying drawings which set forth illustrative embodiments and which are indicative of the various ways in which the principles of the invention may be employed.

BRIEF DESCRIPTION OF THE DRAWINGS

For a better understanding of the various aspects of the invention, reference may be had to preferred embodiments shown in the attached drawings in which.

DETAILED DESCRIPTION

Figure 1:
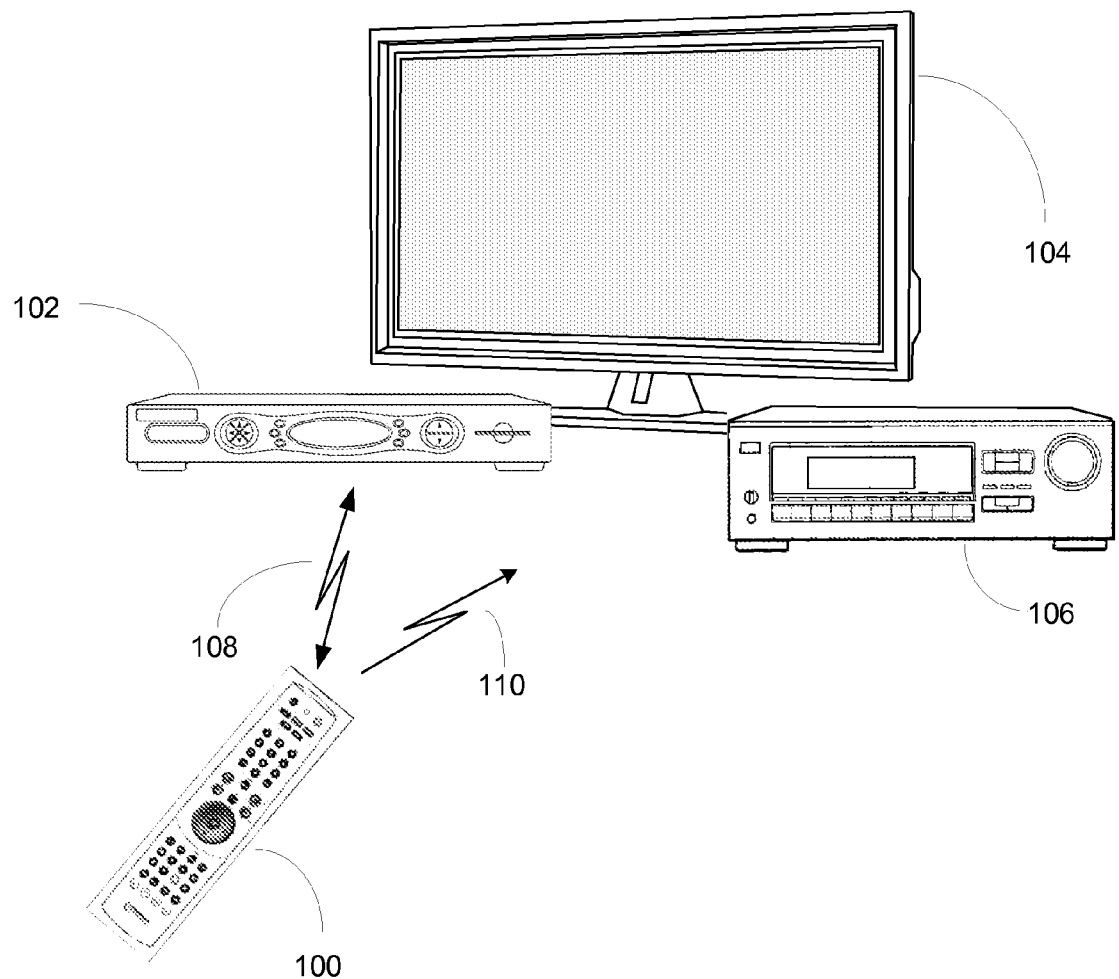
FIG. 1 illustrates a system in which an exemplary controlling device and exemplary controlled appliances communicate using the principles of the instant invention.

The following describes a system and methods by means of which a controlling device, such as a remote control, may engage in bi-directional infrared communication with an appliance while in the presence of a radiated infrared noise source, such as a plasma TV screen. By way of example, FIG. 1 illustrates an exemplary system wherein a controlling device 100 may be used to command functions of various appliances such as an AV receiver 106, a television 104, the set top box itself 102, etc. While not required, the controlling device 100 is most likely to be provided with the cable set top box 102. Controlling device 100 is also capable of bi-directional communication 108 with the set top box 102 in order to perform interactive set up activities and/or download data items such as upgraded infrared commands, program guide information, channel logos, etc. While illustrated in the context of an A/V receiver 106, a television 104, and a set top box 102, it is to be understood that controllable appliances may include, but are not limited to, televisions, VCRs, DVRs, DVD players, cable or satellite converter set-top boxes ("STBs"), amplifiers, CD players, game consoles, home lighting, drapery, fans, HVAC systems, thermostats, personal computers, etc. It will also be appreciated that, while in the illustrative embodiment the set top box 102 is configured to communicate bi-directionally with controlling device 100, in alternative embodiments this function may be performed equally well by any other appliance.

In the embodiment illustrated, controlling device 100 communicates with other controlled devices 104, 106 via a unidirectional infrared (IR) link 110, however, as is known in the art, controlling device 100 may be capable of communicating with these appliances using any convenient IR, RF, point-to-point, or networked protocol to cause the appliances to perform operational functions, provided the control protocols and command values to be used in communicating with a desired appliance are known to the operational software of controlling device 100.

Figure 2:
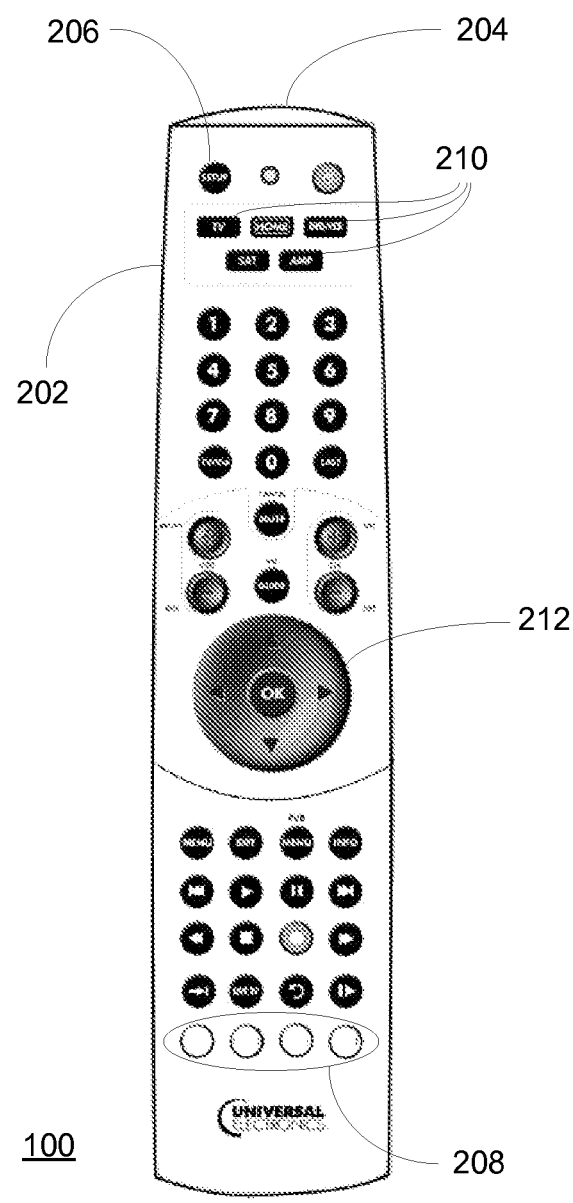
FIG. 2 illustrates the exemplary controlling device of FIG. 1.

With reference to FIG. 2, an exemplary controlling device 100 may comprise a plastic outer case or housing 202 with a front lens portion 204 behind which are mounted infrared transmitting and receiving elements. Lens 204 may be constructed of a material (e.g., polycarbonate) which is optically translucent in the infrared portion of the spectrum. In addition to keys corresponding to controllable function of appliances 102,104,106 controlling device 100 may also include, for example, special purpose keys such as programmable keys 208 whose functionality may be altered and/or enabled via interactive communication with the set top box 102 (e.g., as described in U.S. Pat. No. 7,154,428 "Remote Control with Selective Key Illumination", of like ownership and incorporated herein by reference in its entirety), a set up key 206 which may initiate an interactive configuration transaction with set top box 102, etc.

Figure 3:
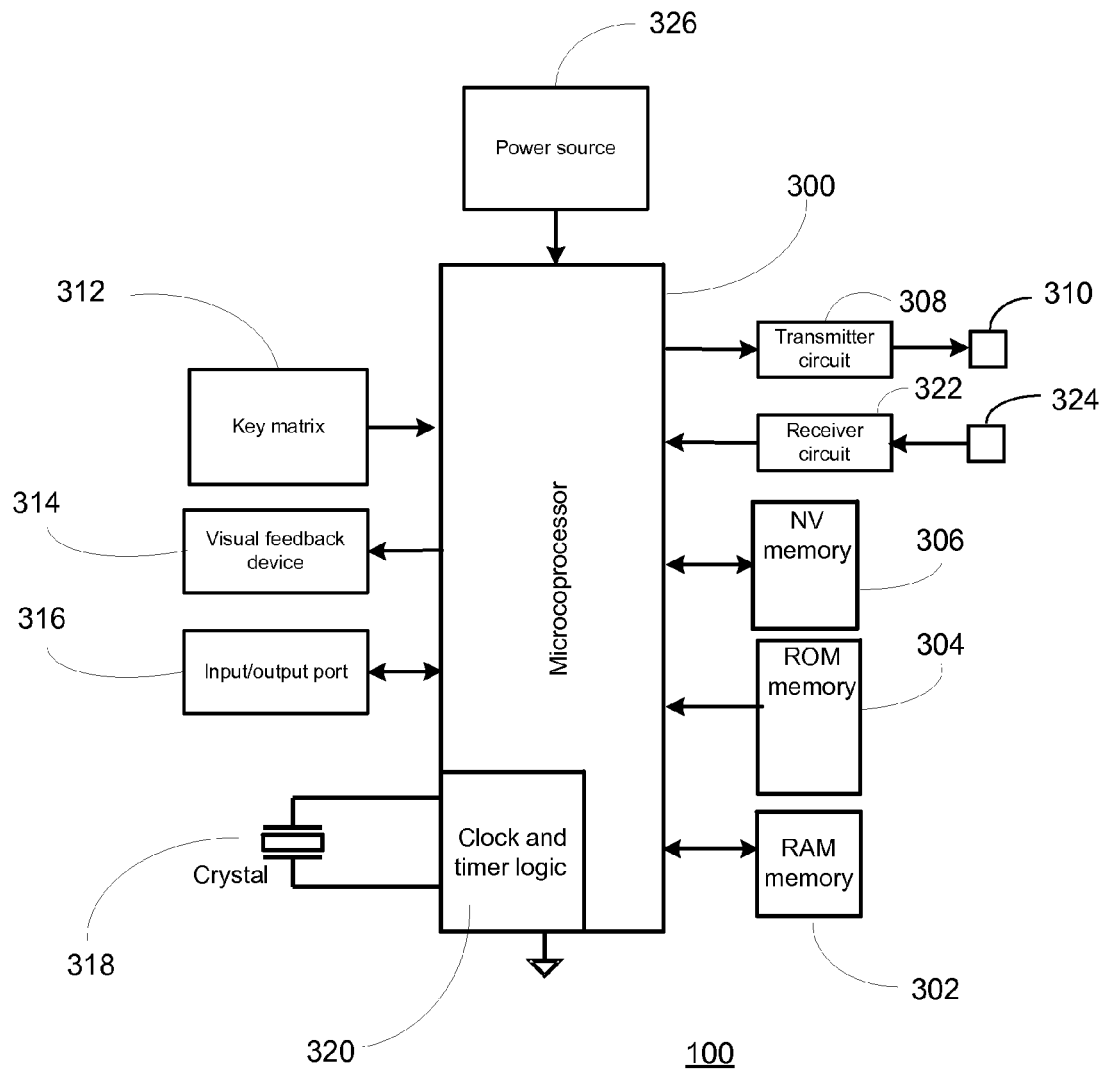
FIG. 3 illustrates a block diagram of exemplary components of the exemplary controlling device of FIG. 1.

With reference to FIG. 3, for use in commanding the functional operations of one or more appliances, the controlling devices 100 may include, as needed for a particular application, a processor 300 coupled to a ROM memory 304, a RAM memory 302, a key matrix 312 (e.g., hard keys, soft keys such as a touch sensitive surface overlaid on a liquid crystal (LCD) or an electroluminescent (EL) display, or some combination thereof), a transmission circuit 308 and associated IR emitter 310, a receiver circuit 322 and associated IR detector 324, a non-volatile read/write memory 306, a means 314 to provide feedback to the user (e.g., one or more visible LEDs, LCD display, speaker, key illumination LEDs for programmable keys 208, backlighting, and/or the like), a power source 326, an input/output port 316 such as a serial interface, modem, USB port, etc., and clock and timer logic 320 with associated crystal or resonator 318.

As will be understood by those skilled in the art, some or all of the memories 302, 304, 306 may include executable instructions (collectively, the program memory) that are intended to be executed by the processor 300 to control the operation of the remote control 100, as well as data that serves to define the aforementioned control protocols and command values to the operational software (collectively, the command data). In this manner, the processor 300 may be programmed to control the various electronic components within the remote control 100, e.g., to monitor the power supply 310, to cause the transmission and reception of signals, control visual feedback device(s) 314, etc. All or part of the non-volatile read/write memory 306, for example an EEPROM, battery-backed up RAM, FLASH, Smart Card, memory stick, or the like, may additionally be used to store setup data and parameters as necessary. While the memory 304 is illustrated and described as a ROM memory, memory 304 may also be comprised of any type of readable media, such as ROM, FLASH, EEPROM, or the like. Preferably, the memories 304 and 306 are non-volatile or battery-backed such that data is not required to be reloaded after battery changes. In addition, the memories 302, 304 and 306 may take the form of a chip, a hard disk, a magnetic disk, an optical disk, and/or the like. Still further, it will be appreciated that some or all of the illustrated memory devices may be physically incorporated within the same IC chip as the microprocessor 300 (a so called "microcontroller") and, as such, they are shown separately in FIG. 3 only for the sake of clarity.

To cause the controlling device 100 to perform an action, controlling device 100 is adapted to be responsive to events, such as a sensed user interaction with the key matrix 312, etc. In response to an event, appropriate instructions within the program memory (hereafter the "operating program") may be executed. For example, when a function key is actuated on the controlling device 100, the controlling device 100 may retrieve from the command data stored in memory 302, 304, and/or 306 the command value and control protocol currently assigned to the actuated function key and the currently assigned device mode to thereby transmit a command to an intended target appliance, e.g., the STB 102 or the TV 104, in a format recognizable by the intended target appliance.

In certain embodiments, controlling device 100 may be universal, that is adaptable to issue commands to a multiplicity of appliances of different type and/or manufacture. In such cases, for selecting a set of command data to be associated with an appliance to be controlled, data may be provided to the controlling device 100 that serves to identify an intended target appliance by its type and make (and sometimes model). Such data allows the controlling device 100 to identify the appropriate command data within a preprogrammed library of command data that is to be used to transmit recognizable commands in a format appropriate for such identified appliances. Multiple methods for providing such setup data may be supported by the controlling device 100, including some or all of the known setup procedures described, for example, in U.S. Pat. Nos. 4,959,810, 5,614,906, and 6,225,938 which describe self-contained setup of controlling devices, and U.S. patent application Ser. Nos. 09/804,623 and 09/615,473 which describe setup of controlling devices by interaction with a Web site. It will also be appreciated that the controlling device 100 may be set up to command operations of an appliance 104, etc. by being taught the command codes needed to command such appliance as described in U.S. Pat. No. 4,623,887. Alternatively, controlling device 100 may be set up to command operations of an appliance 104 via interaction with another appliance, e.g., the set top box 102, as further described hereinafter. Still further, it will be understood that command data may be pre-stored in the controlling device 100 or the controlling device 100 may be upgradeable with new command data and/or operating program instructions, for example by transfer via external input port 316 as described, for example, in the aforementioned U.S. Pat. No. 4,959,810, or by transfer from the set top box 102 via the two-way communication link components 308, 310 and 322, 324.

Figure 4:
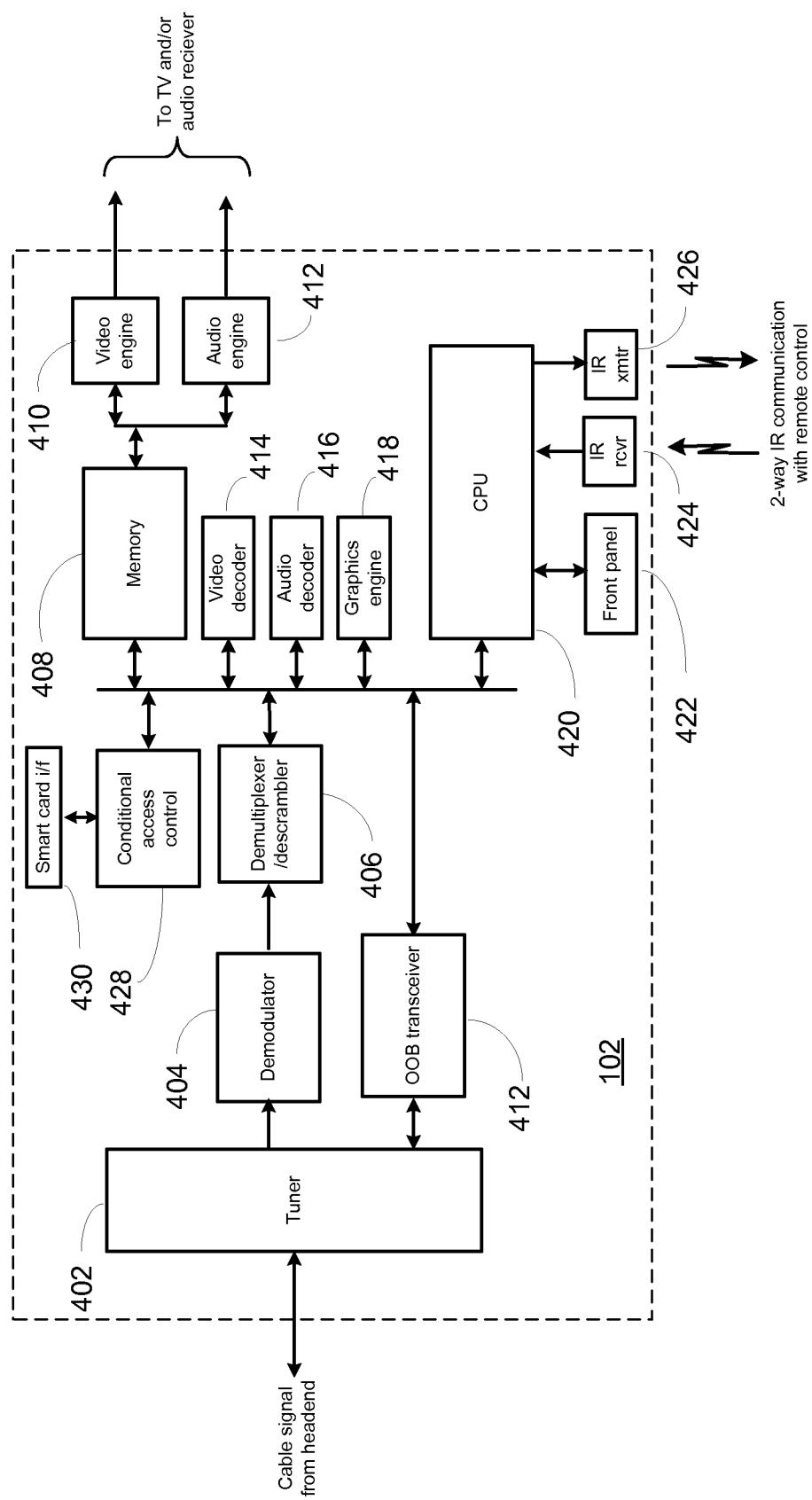
FIG. 4 illustrates a block diagram of exemplary components of an exemplary set top box appliance of FIG. 1.

An exemplary architecture of a set top box (e.g., the set top box 102) suitable for use in the system of FIG. 1 and implementation of the features described hereinafter is illustrated in FIG. 4. Such a set top box may include a cable system interface comprising a tuner 402 for selection of a particular signal originating from a cable system head end; a demodulator 404 for demodulating that signal (e.g., a QAM encoded bit stream) into binary data; a demultiplexer 406 for separating the resulting binary data stream into it's constituent parts (e.g., MPEG encoded video, AC3 encoded audio, etc.); and an out of band transceiver 412 for transfer of control information, software updates, program guide data, etc.; all under the control of a processor 420 responsive to an operating program resident in memory 408. A conditional access controller 428 may also be provided to decrypt and/or otherwise enable various tiers of subscription service, in some embodiments in conjunction with an access card 430. Also under the control of the processor 420 and the operating program, received media data is decoded by video and audio decoders 414, 416 and provided to video and audio output engines 410, 412 for rendering on, for example, television 104. Additionally, a graphics engine 418 may be provided to allow the processor and operating program to display locally-sourced information, e.g., guide data, set up menus, etc., either overlaid onto, in conjunction with, or in place of the media stream currently being received. For user interface purposes, a front panel 422 and two-way remote control communication link components 424,426 are provided. Set top box memory 408 may comprise RAM, ROM, FLASH, EEPROM, optical storage, magnetic storage, or any combination thereof, and may take the form of a chip, smart card, memory stick, hard disk, magnetic disk, optical disk, and/or the like. Set top box memory 408 may store software instructions for controlling the functions of the set top box (i.e., an operating program); application programs (e.g., program guides, games, device setup applications, help menus, etc.) which may be permanently retained in the memory or may be transient, e.g., temporarily provisioned via out of band transceiver 412, access card 430, etc.; data for use in such operations (e.g., channel-line up, program guide information, etc.); user preference information and settings; display templates and graphics for menus or messages; etc. Additionally, portions of set top box memory 408 may serve as buffers for incoming and outgoing media data streams as they are decoded, processed and output to connected devices.

Figure 5:
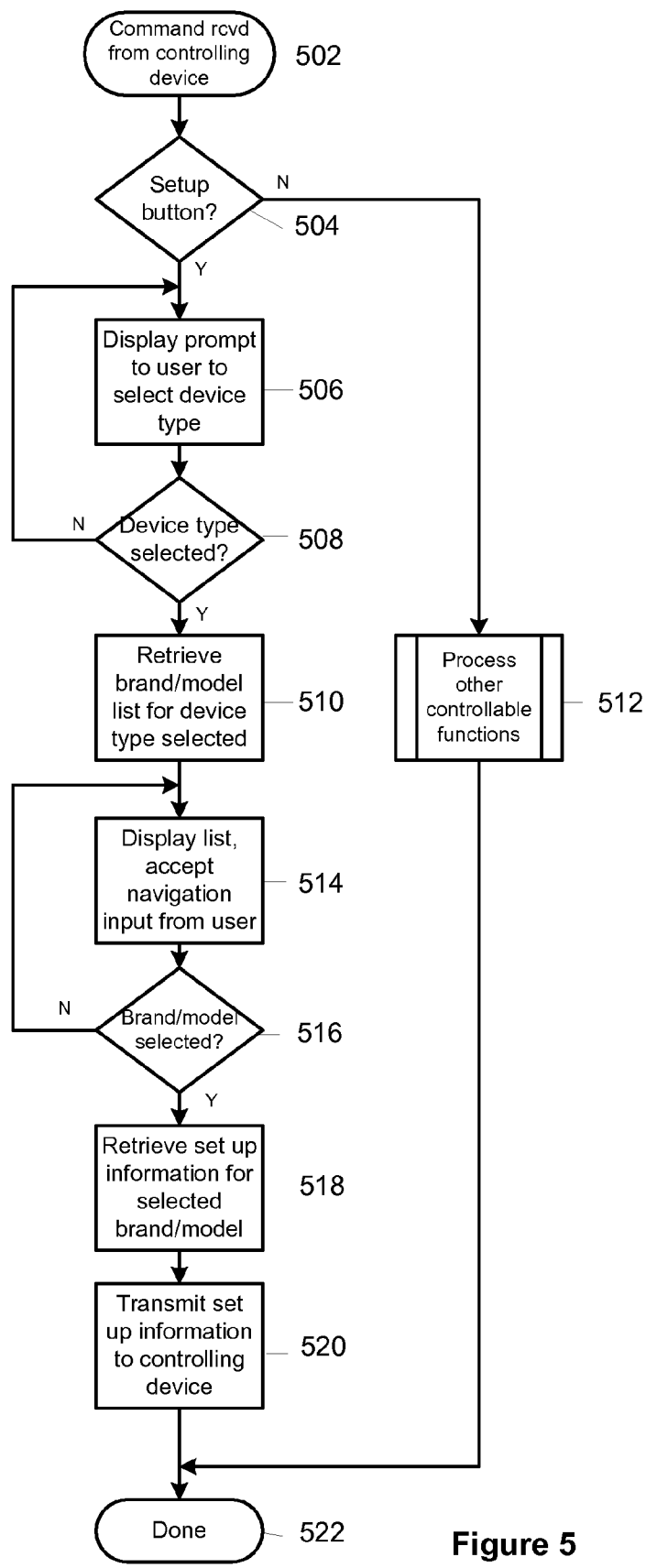
FIG. 5 illustrates in flow chart form an exemplary method for interactive setup of an exemplary controlling device.

As mentioned above, the exemplary set top box architecture presented in conjunction with FIG. 4 may support specialized application programs in addition to the conventional channel tuning and media decoding functionality as is well known in such devices. By way of example, an additional program supported by the cable set top box 102 may be an interactive remote control setup application as generally illustrated in the flowchart of FIG. 5. Such an application may be offered to facilitate the configuration of a universal controlling device to match the universal controlling device to specific appliances to be controlled, for example, to configure the controlling device 100 to correctly operate audio receiver 106 and TV 104. When a user of controlling device 100 activates a setup button 206, controlling device 100 may transmit a command signal indicative of this action to the set top box 102, initiating a bi-directional communication session with the set top box 102. Upon receipt 502 of such a signal, the set top operating program may first check 504 if the received signal is a set up command. If not, the signal is processed as a remotely controllable command function 512 as is well known in the art.

If, however, the received signal comprises a set up request, the set up application is invoked. By way of example only, the set up application may first cause display on TV 104 (via graphics and video engines 418, 410) a prompt requesting the user to select a device type to be set up. The user indicates the desired selection, for example, by activating one of the device selection buttons 210 on controlling device 100, by navigating a displayed menu, etc. When the resultant signal representative of the desired device type or device type selection is received 508 at the set top box, the set up application may retrieve a list of brands and/or models corresponding to available IR codes for that type of device. Such a list may be pre-stored in memory 408 as part of the set up application data, or may be retrieved from a library of codes available at a remote server accessible, for example, via out of band transceiver 412. Once in possession of the data, the set up application may display this 514 in user-scrollable list form on TV 014. The user may then use the navigation pad 212 of controlling device 100 to scroll to and select 516 their appliance brand and/or model from the list. Once the selection has been received, the set up application may retrieve the set up information for the desired brand and/or model. Such set up information may comprise, without limitation, a pointer, reference, or other indicia to a set of infrared command data already stored in one or more of the memories 302, 304, 306 of controlling device 100; a downloadable set of infrared command data stored locally in set top box memory 408; or a downloadable set of infrared command data retrieved from a database available at a remote server. Once in possession of the appropriate set up information, the set up application may transfer this information to the controlling device 100 for use by the controlling device 100 to complete the configuration process.

To conduct this interaction and data transfer, set top box 102 and controlling device 100 may use any convenient bi-directional infrared protocol, as are well known in the art. For additional information regarding such protocols, the interested reader may turn to U.S. Pat. No. 7,167,913 "System and Method for Managing Communication Links" of like assignee and incorporated herein by reference in its entirety, or to U.S. Pat. No. 5,455,570 "Methods and Apparatus for Communication Program Data Signals Via a Remote Control Unit." Further, in keeping with the teachings of the instant invention, devices 100 and/or 102 may incorporate measures to reduce potential interference from IR noise sources such as, for example, plasma TV screens, as described further hereafter.

It will be appreciated by those of skill in the art that various alternative embodiments of set top box architecture are possible, as are added features such as for example dual tuners, DVR capability, Ethernet or WiFi network interfaces, etc., and various other specialized applications, for example set top box controllable key functions 208 and/or displays on controlling device 100, as are described in greater detail in U.S. Pat. No. 7,154,428 "Remote Control with Selective Key Illumination," of like assignee and incorporated herein by reference in its entirety. It will also be appreciated that the architecture and applications described in conjunction with FIGS. 4 and 5 are not limited to cable set top boxes, but may apply mutatis mutandis to similar devices having the capability of receiving satellite or digital terrestrial broadcasts, having network connectivity capabilities, and/or having media playback capabilities (whether stand-alone or via interconnection with a display device), etc., such as a game console, a "cable ready" TV, a DVR, etc. Accordingly, it is to be understood that the examples presented are illustrative of one of many possible platforms upon which the methods of the instant invention may be practiced, and are not intended to be limiting.

Figure 6:
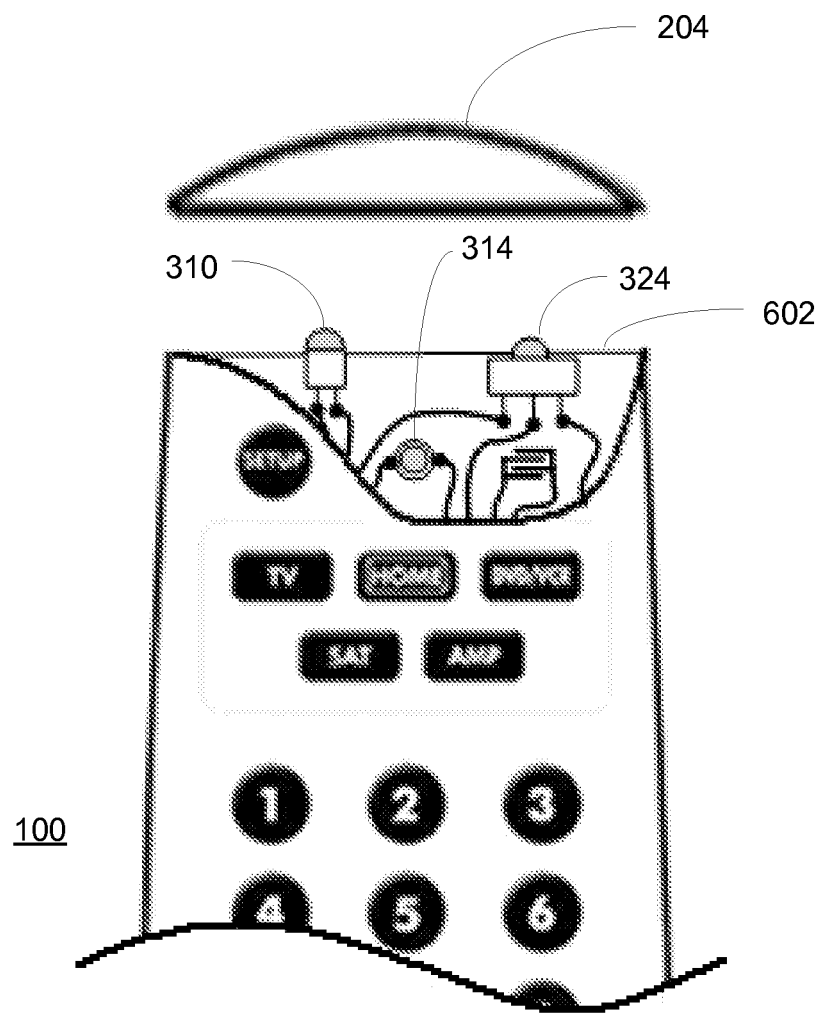
FIG. 6 illustrates a cut-away view of a portion of the exemplary controlling device of FIG. 1.

FIG. 6 presents a cutaway view of the top section of an exemplary controlling device 100, with front lens 204 detached, revealing the upper portion of the internal printed circuit board 602 and the components mounted thereon. In particular, for the embodiment illustrated, IR emitter 310 is situated towards the left side of printed circuit board 602, while IR detector 324 is situated towards the right side of printed circuit board 602, thereby positioning these items behind the left and right sides of front lens 204 respectively.

Figure 7:
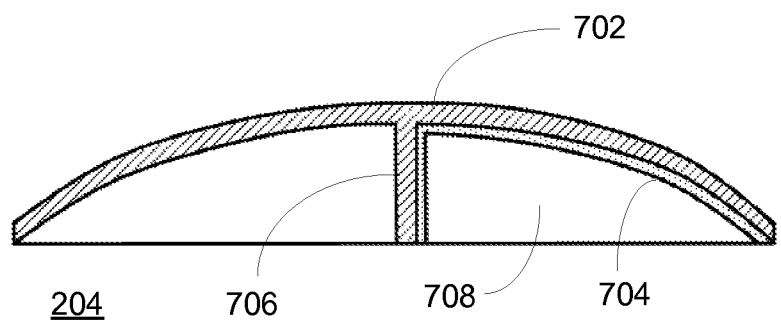
FIG. 7 illustrates a sectional view of the front lens of the exemplary controlling device of FIG. 1.

As illustrated in FIG. 7, in one embodiment an infrared attenuation film 704 such as, for example, coating #2005 from Evaporated Coatings Inc. of Willow Grove Pa., may be applied to the portion of the front lens 204 behind which the IR detector 324 of FIG. 5 is situated. The effect of such a coating is to reduce the intensity of all infrared radiation reaching detector 324, including infrared noise radiated by a plasma television screen, e.g., the television 104. According to the method of the instant invention, the output of the set top box infrared transmitter 426 is increased by an amount commensurate with the attenuation introduced in front of detector 324 by lens coating 704, i.e., the perceived intensity of the desirable infrared signals at the detector remains unchanged from that of a prior art system using unattenuated optics. The resulting improvement of signal to noise ratio at detector 324 thus provides more reliable performance when the bidirectional infrared communication system is used in the presence of a plasma display screen. In certain embodiments, lens 204 may include an internal baffle 706 to further isolate the intentionally attenuated area 708. It will be appreciated however that in other embodiments such a baffle may be reduced in size, eliminated entirely, or placed in a location other than that illustrated. It will also be appreciated that alternative methods may be used to obtain the desired attenuation characteristic. For example, in lieu of an applied attenuation coating a lens may be molded from two or more different plastic compounds with differing degrees of IR translucency.

In a still further alternative embodiment, electrical attenuation may be applied at the controlling device IR receiver in place of or in addition to the optical attenuation described above. In such an embodiment, the gain of the IR receiver circuit 322 of controlling device 100 may be reduced in conjunction with a commensurate increase in the output of the set top box IR transmitter 426. The adjustments to IR receive gain and transmit power may be fixed, in which case system operation is similar to that already described, or these adjustments may be switchable, as will now be described in further detail.

Figure 8:
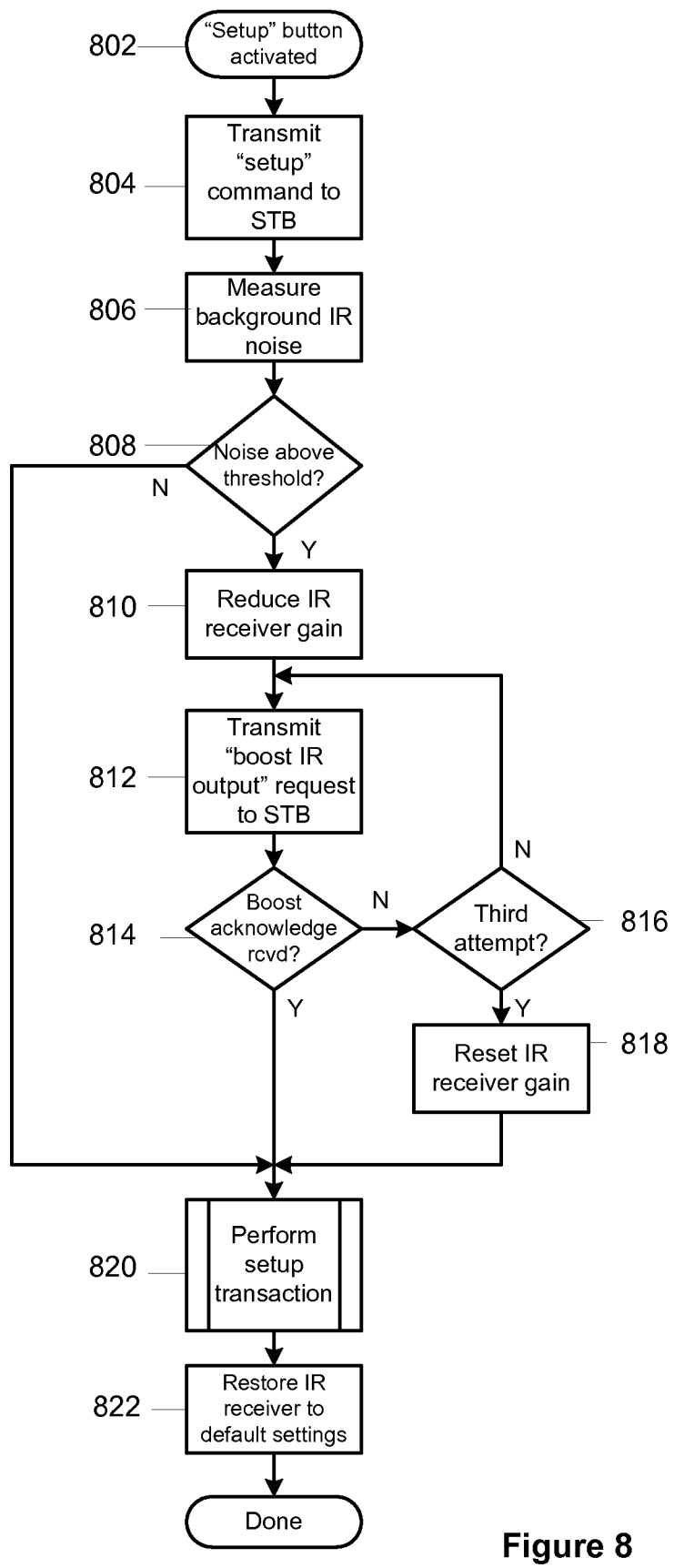
FIG. 8 illustrates in flow chart form an exemplary method for controlling infrared receiver gain in an exemplary controlling device.

In certain implementations of this embodiment, the gain of controlling device IR receiver 322 may be controllable by microprocessor 300 and may, in the presence of a cooperating set top box, be varied in response to a detected level of IR noise. Turning to FIG. 8, when setup button 206 of exemplary controlling device 100 is activated 802, the operating program of controlling device commences the setup transaction by transmitting a "setup" command 804 to the set top box 102. Thereafter, the operating program may enable its IR receiver 322,324 at normal gain and measure the background IR noise level present in the current environment 806, e.g., the IR noise level created by the plasma TV. At step 808 the operating program may then compare the measured value to a pre-established threshold representing the level at which background IR noise may begin to interfere with reception of IR data signals transmitted from the set top box 102. If the measured IR noise does not exceed the threshold, the operating software may proceed to conduct the setup transaction 820 with the gain of IR receiver 322 at its normal value. If, however, the operating software determines that the IR noise exceeds the threshold, it may reduce the gain of IR receiver 322 (at step 810) and transmit a request 812 to the set top box 102 to boost the output level of IR transmitter 426. If set top box 102 is equipped to support this feature, it may adjust its transmitter output appropriately and acknowledge receipt of the request. Once this acknowledgement is received 814, the operating software may proceed to conduct the setup transaction 820 with the gain of IR receiver 322 at its reduced value. Once the setup transaction is complete, IR receiver gain may be reset to its normal value 822 prior to exiting the process. If the acknowledgement is not received (for example, after a timeout) the operating software may re-issue the request. If no acknowledgement is received after several such retries 816, the operating software may reset the gain of the controlling device's IR receiver 322 back to normal 818 and attempt to conduct the setup transaction regardless. It will be appreciated from the foregoing that a controlling device implemented according to this method may be operable with set top boxes equipped to support a transmit boost capability as well as those that are not: if no source of infrared interference is present, no receiver attenuation will be attempted; while in the presence of interference, if no acknowledgement is received from the set top box the controlling device will attempt to conduct the transaction regardless, at normal receiver gain.

While various concepts have been described in detail, it will be appreciated by those skilled in the art that various modifications and alternatives to those concepts could be developed in light of the overall teachings of the disclosure. For example, while specific illustrative embodiments are presented above in the context of an interactive controlling device setup application, it will be appreciated that in alternate embodiments the inventive methods and techniques described herein may be generally applied to any situation in which bidirectional infrared communication is to be transacted in an environment subject to interference from sources of infrared noise. Similarly, while specific illustrative embodiments are presented in which a plasma television is the source of IR noise, it will be appreciated that the systems and methods described herein are equally usable to facilitate IR communications in the presence of IR noise sources beyond just the described plasma television.

Further, while described in the context of functional modules and illustrated using block diagram format, it is to be understood that, unless otherwise stated to the contrary, one or more of the described functions and/or features may be integrated in a single physical device and/or a software module, or one or more functions and/or features may be implemented in separate physical devices or software modules. It will also be appreciated that a detailed discussion of the actual implementation of each module is not necessary for an enabling understanding of the invention. Rather, the actual implementation of such modules would be well within the routine skill of an engineer, given the disclosure herein of the attributes, functionality, and inter-relationship of the various functional modules in the system. Therefore, a person skilled in the art, applying ordinary skill, will be able to practice the invention set forth in the claims without undue experimentation. It will be additionally appreciated that the particular concepts disclosed are meant to be illustrative only and not limiting as to the scope of the invention which is to be given the full breadth of the appended claims and any equivalents thereof.

All patents cited within this document are hereby incorporated by reference in their entirety.

What is claimed is:

1. A method for facilitating infrared (IR) communications from a first device to a second device in the presence of an external IR noise source being generated by a third device, comprising:
   initiating an IR transmission from the first device to the second device;
   detecting at the second device a level of external IR noise being generated by the third device; and
   causing the IR transmission to be dynamically attenuated at the second device as a function of the detected level of external IR noise being generated by the third device.

2. The method as recited in claim 1, comprising electrically attenuating the IR transmission at the second device.

3. The method as recited in claim 1, comprising optically attenuating the IR transmission at the second device.

4. The method as recited in claim 1, wherein the second device comprises a remote control adapted to control functions of at least the first device and an IR receiver for receiving the IR transmission from the first device and wherein the first device comprises a set top box.

5. The method as recited in claim 4, wherein the remote control comprises a lens cover for the IR receiver and the lens cover optically attenuates the IR transmission.

6. The method as recited in claim 4, comprising electrically attenuating the IR transmission once received by the IR receiver.

7. The method as recited in claim 1, comprising boosting a level of the IR transmission at the first device.

8. The method as recited in claim 7, comprising dynamically boosting a level of the IR transmission at the first device as a function of the detected level of external IR noise being generated by the third device.

9. The method as recited in claim 8, comprising causing the second device to instruct the first device to boost the level of the IR transmission as a function of the detected level of external IR noise being generated by the third device.

10. The method as recited in claim 7, wherein the level of the IR transmission at the first device is boosted in response to a signal being transmitted to the first device by the second device.

11. The method as recited in claim 10, wherein the level of the IR transmission at the first device is boosted in response to the first device detecting an absence of a signal being transmitted by the second device.

12. A method for facilitating infrared (IR) communications from a set top box device to a remote control device in the presence of an IR noise being generated by a display device, comprising:
   initiating an IR transmission from the set top box device to the remote control device; and
   dynamically boosting at the set top box a level of the IR transmission from the set top box device to the remote control device in response to the set top box device detecting an absence of a signal being transmitted to the set top box device by the remote control device.

13. The method as recited in claim 12, wherein the display device comprises a plasma television.

14. The method as recited in claim 12, wherein the IR transmission comprises remote control configuration data.

15. The method as recited in claim 12, wherein the level of the IR transmission is dynamically boosted at the set top box until the set top box device detects a recognizable signal being transmitted to the set top box device by the remote control device.

* * * * *